United States Patent
Bonora et al.

[11] Patent Number: 6,138,721
[45] Date of Patent: Oct. 31, 2000

[54] TILT AND GO LOAD PORT INTERFACE ALIGNMENT SYSTEM

[75] Inventors: Anthony C. Bonora, Menlo Park; Edward J. Cortez; John D. Kyffin, both of San Jose; Michael Ng, Campbell, all of Calif.

[73] Assignee: Asyst Technologies, Inc., Fremont, Calif.

[21] Appl. No.: 09/145,704

[22] Filed: Sep. 2, 1998

Related U.S. Application Data

[60] Provisional application No. 60/057,887, Sep. 3, 1997.

[51] Int. Cl.[7] ................................................ B65B 1/04
[52] U.S. Cl. ........................ 141/98; 141/231; 414/222; 414/416; 414/935; 414/940; 414/598; 280/47.24
[58] Field of Search ............................ 438/106; 414/935, 414/940, 231, 234, 243, 598, 222, 416; 141/98, 231; 280/47.24

[56] References Cited

U.S. PATENT DOCUMENTS 5,468,111  11/1995  Flint et al. .
5,655,869  8/1997  Scheler et al. .
5,668,056  9/1997  Wu et al. .................... 438/106

*Primary Examiner*—Steven O. Douglas
*Assistant Examiner*—Timothy L. Maust
*Attorney, Agent, or Firm*—Fliesler, Dubb, Meyer & Lovejoy LLP

[57] ABSTRACT

A tilt and go assembly included as part of a load port interface assembly is disclosed for providing quick and easy attachment and adjustment of the load port interface assembly to a BOLTS interface. When a load port interface assembly according to the present invention is positioned adjacent to a BOLTS interface, the assembly is tilted away from the BOLTS interface, so that a socket in the load port interface assembly may raise upward slightly and be seated on the ball joint. Thereafter, the upper portions of the load port interface assembly may be tilted upward so that the assembly is roughly parallel and adjacent to the BOLTS interface. Once the load port interface assembly is seated on the ball joint of the BOLTS interface, the vertical and lateral positions of the load port interface assembly may be adjusted as desired with respect to the BOLTS interface. Additionally, after the vertical and lateral positions of the load port interface assembly have been adjusted, the azimuth and roll angle of the load port interface assembly may be adjusted with respect to the BOLTS interface.

16 Claims, 5 Drawing Sheets

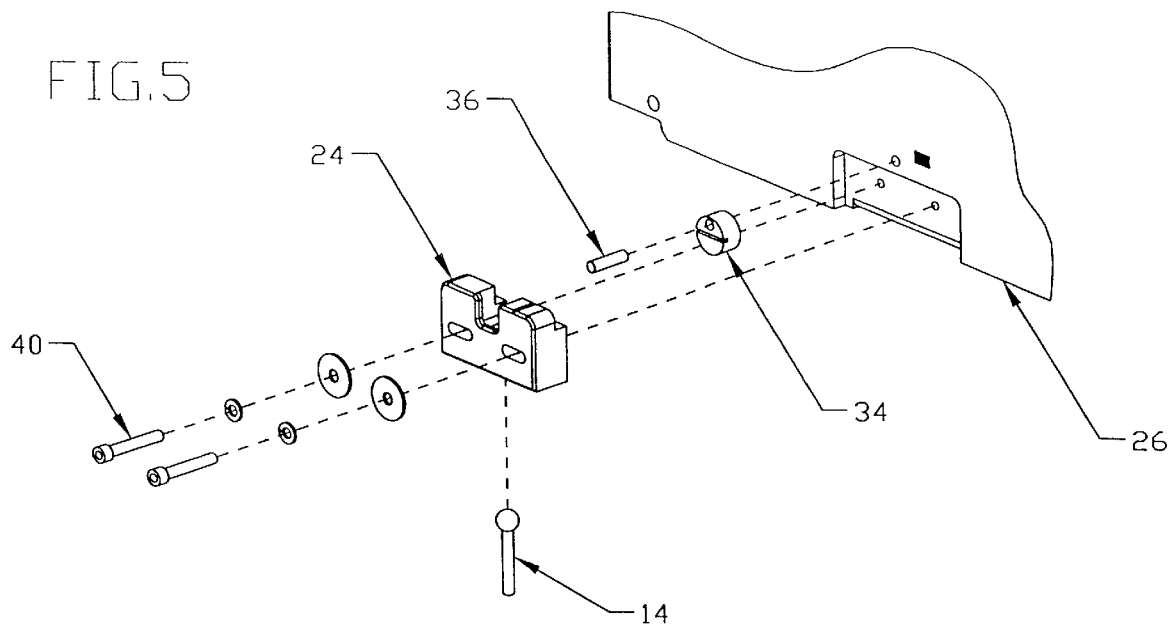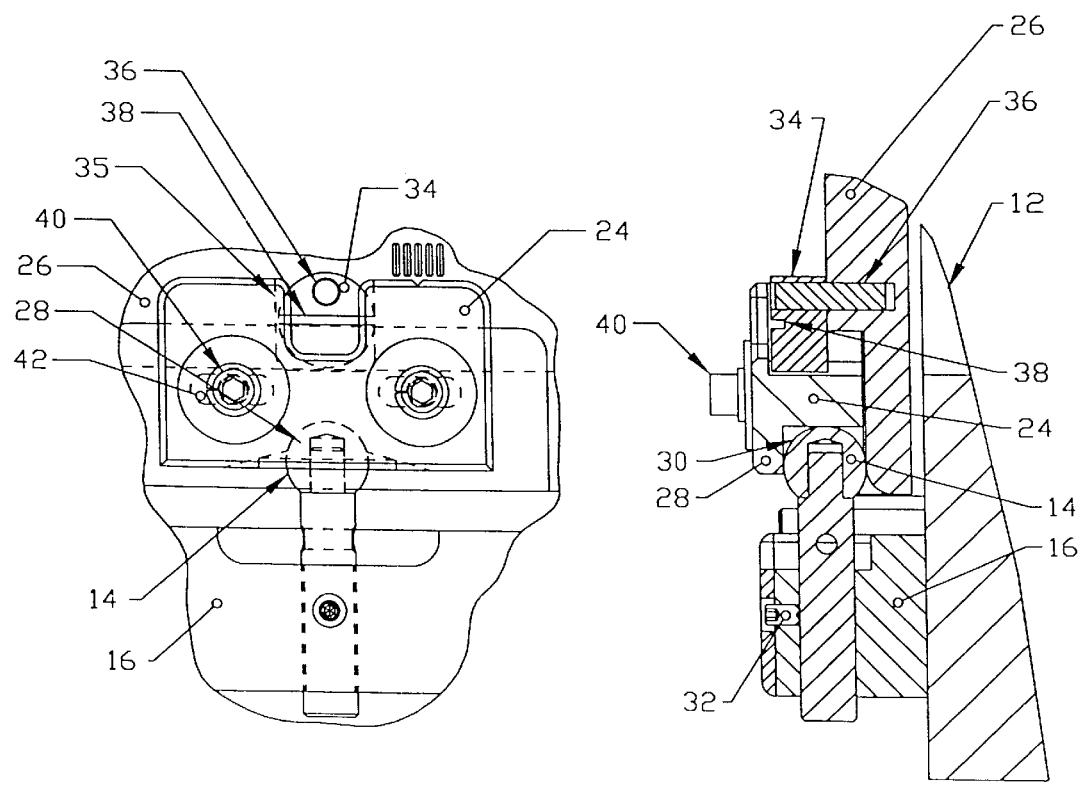

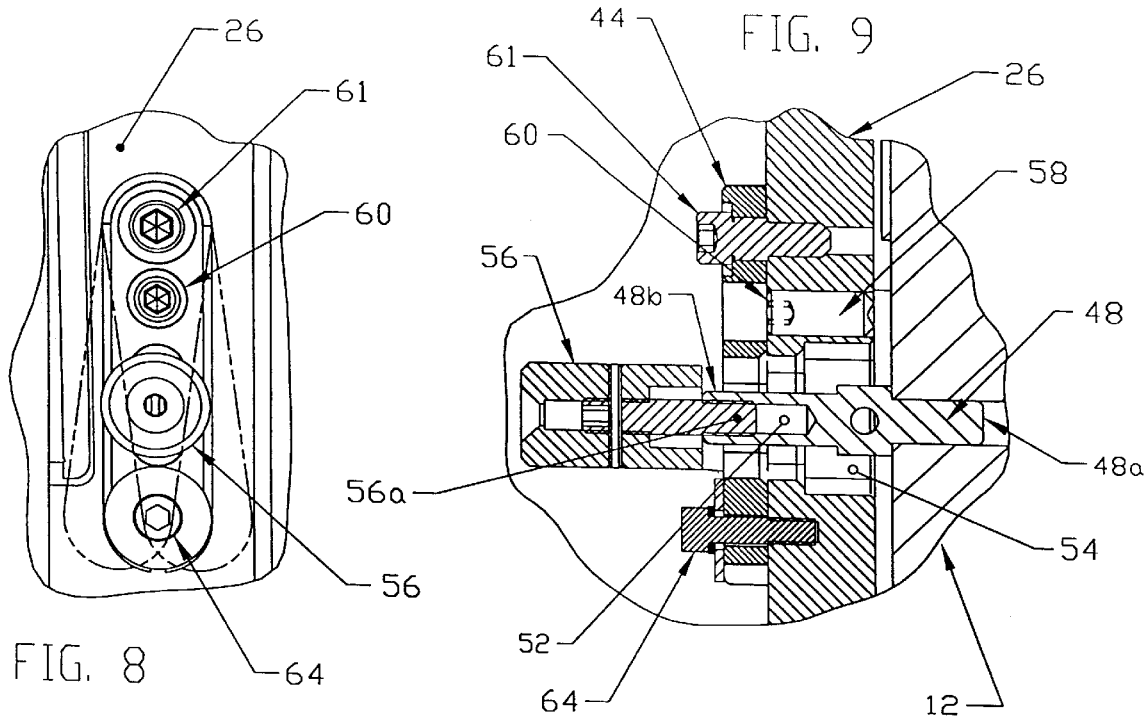
FIG. 9
FIG. 8
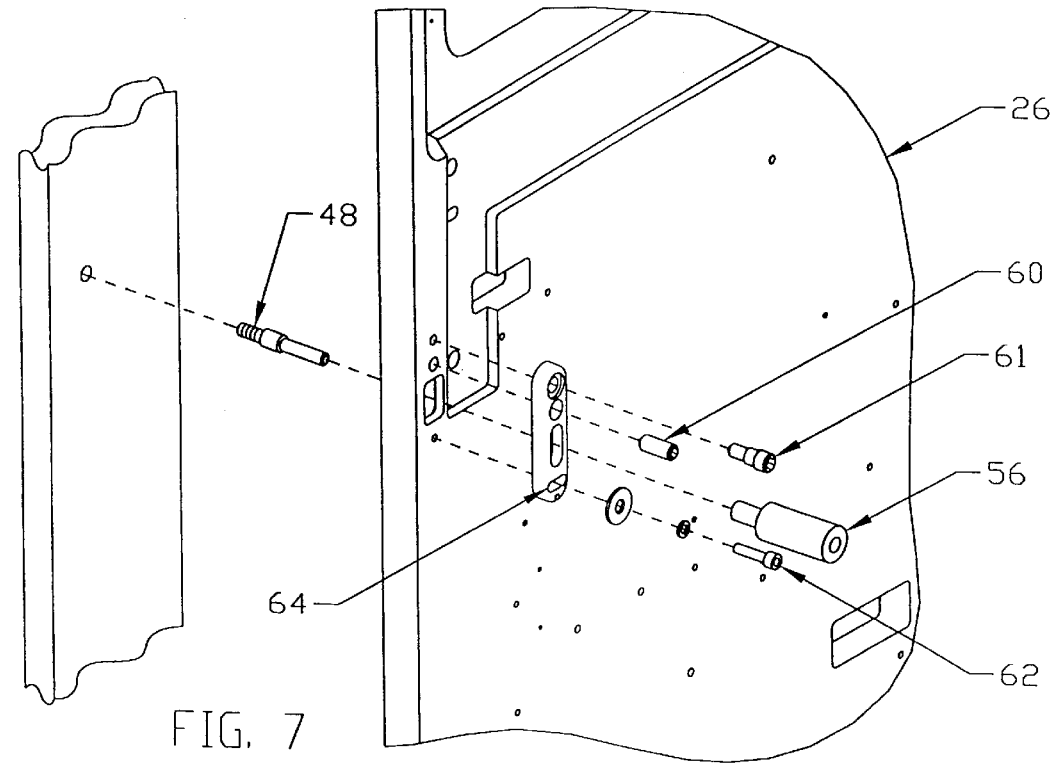
FIG. 7

TILT AND GO LOAD PORT INTERFACE ALIGNMENT SYSTEM

The present application claims priority of U.S. Provisional Patent Application No. 60/057,887, filed on Sep. 3, 1997.

BACKGROUND OF THE INVENTION

1. Field of the Invention

The present invention relates to an interface for transferring workpieces such as semiconductor wafers, reticles and flat panel displays between a carrier for the workpieces and a process tool, and in particular to a system facilitating quick and easy mounting of a load port onto a BOLTS interface.

2. Description of Related Art

A SMIF system proposed by the Hewlett-Packard Company is disclosed in U.S. Pat. Nos. 4,532,970 and 4,534,389. The purpose of a SMIF system is to reduce particle fluxes onto semiconductor wafers during storage and transport of the wafers through the semiconductor fabrication process. This purpose is accomplished, in part, by mechanically ensuring that during storage and transport, the gaseous media (such as air or nitrogen) surrounding the wafers is essentially stationary relative to the wafers, and by ensuring that particles from the ambient environment do not enter the immediate wafer environment.

A SMIF system has three main components: (1) minimum volume, sealed pods used for storing and transporting wafers and/or wafer cassettes; (2) an input/output (I/O) minienvironment located on a semiconductor processing tool to provide a miniature clean space (upon being filled with clean air) in which exposed wafers and/or wafer cassettes may be transferred to and from the interior of the processing tool; and (3) an interface for transferring the wafers and/or wafer cassettes between the SMIF pods and the SMIF minienvironment without exposure of the wafers or cassettes to particulates. Further details of one proposed SMIF system are described in the paper entitled "SMIF: A TECHNOLOGY FOR WAFER CASSETTE TRANSFER IN VLSI MANUFACTURING," by Mihir Parikh and Ulrich Kaempf, *Solid State Technology*, July 1984, pp. 111–115.

SMIF pods are in general comprised of a pod door which mates with a pod shell to provide a sealed environment in which wafers may be stored and transferred. At present, there are different configurations of SMIF pods owing in part to the different wafer sizes and tool interface orientations currently found in wafer fabs. In addition to existing 200 mm wafers, processing of 300 mm wafers has been introduced in recent years. Different pods and pod handling equipment are employed depending on whether processing is being performed on 200 mm or 300 mm wafers. Additionally, SMIF pods may either be bottom opening or front opening. In bottom opening SMIF pods, the pod door is provided horizontally at the bottom of the pod, and the wafers are supported in a cassette which is in turn supported on the pod door. In front opening pods, the pod door is located in a vertical plane, and the wafers are supported in parallel horizontal planes on shelves mounted within the pod shell. Such pods are commonly referred to as front opening unified pods, or FOUPs.

Process tools typically include load ports affixed to their front end so that pods or stand-alone cassettes may be positioned adjacent the process tool in preparation for the wafers and/or wafer cassettes to be transferred into the process tool. For wafer fabs utilizing 300 mm wafers in front opening pods, a vertically oriented frame, commonly referred to as a box opener-loader tool standard interface (or "BOLTS" interface), has been developed by Semiconductor Equipment and Materials International ("SEMI"). The BOLTS interface attaches to, or is formed as part of, the front end of a process tool, and provides standard mounting points for a load port to attach to the process tool. The BOLTS interface also provides a reference position so that a fixed distance between the BOLTS interface and the center of a wafer on the load port may be defined. Thus, although equipment manufactures make various configurations of load ports for 300 mm front opening pods, each load port may be operationally connected to a process tool as long as the load port is configured to attach to the defined standardized BOLTS interface frame.

Presently, connection of a tool load port to a BOLTS interface is a cumbersome and difficult task. Tool load ports for 300 mm wafers are generally large and heavy. Although their configuration may vary significantly, a typical load port may have a height and width of four to five feet, by eighteen inches, and a weight of approximately sixty pounds. In order to bolt a tool load port onto a BOLTS interface, it is presently necessary to cart the load port to the interface, position the load port at the proper location on the BOLTS interface, and thereafter bolt the load port to the interface. Additionally, when attaching the load port to the BOLTS interface, several small adjustments are necessary to properly position the load port on the interface. Two people are required to lift and properly align the load port to the BOLTS interface plate, and a third is required to screw the load port to the BOLTS interface plate once properly positioned. This process is both time and man-hour consuming, and may create physical strains or injuries to the installing technicians.

SUMMARY OF THE INVENTION

It is therefore an advantage of the present invention to provide a tilt and go assembly as part of a load port interface assembly for allowing quick and easy connection of the load port interface assembly to a BOLTS interface.

It is another advantage of the present invention to provide a tilt and go assembly as part of a load port interface assembly to allow the load port interface assembly to be affixed to a BOLTS interface by a single person.

It is a further advantage of the present invention to allow easy vertical adjustment of the load port interface assembly with respect to the BOLTS interface once the load port interface assembly is roughly positioned on the BOLTS interface.

It is a further advantage of the present invention to allow easy lateral adjustment of the load port interface assembly with respect to the BOLTS interface once the load port interface assembly is roughly positioned on the BOLTS interface.

It is a further advantage of the present invention to allow quick and easy adjustment of the load port interface assembly toward and away from the BOLTS interface once the load port interface assembly is roughly positioned on the BOLTS interface.

It is a further advantage of the present invention to allow quick and easy adjustment of the tilt angle of the load port interface assembly with respect to the BOLTS interface in a plane parallel to the BOLTS interface once the load port interface assembly is roughly positioned on the BOLTS interface.

These and other advantages are provided by the present invention which in general relates to a tilt and go assembly included as part of a load port interface assembly for providing quick and easy attachment and adjustment of the load port interface assembly to a BOLTS interface. The tilt and go assembly includes wheels on a bottom portion of the load port interface assembly so that the load port interface assembly may be easily transported to a BOLTS interface to which the load port interface assembly is to be affixed. A BOLTS interface conventionally includes a ball joint at a bottom portion of the interface frame. When a load port interface assembly according to the present invention is positioned adjacent to a BOLTS interface, the assembly is tilted away from the BOLTS interface, so that a socket in the load port interface assembly may raise upward slightly and be seated on the ball joint. Thereafter, the upper portions of the load port interface assembly may be tilted upward so that the assembly is roughly parallel and adjacent to the BOLTS interface.

Once the load port interface assembly is seated on the ball joint of the BOLTS interface, the vertical and lateral positions of the load port interface assembly may be adjusted as desired with respect to the BOLTS interface. Additionally, after the vertical and lateral positions of the load port interface assembly have been adjusted, the azimuth and roll angle of the load port interface assembly may be adjusted with respect to the BOLTS interface. Adjustment of the azimuth angle of the load port interface assembly allows the assembly to be tilted toward and away from the BOLTS interface about an axis through the ball joint on the BOLTS interface. Adjustment of the roll angle of the load port interface assembly allows the assembly to be tilted in a plane parallel to the BOLTS interface about an axis through the ball joint on the BOLTS interface. Once all of the adjustments have been made, the tilt and go assembly further includes locking mechanisms for securing the load port interface assembly in a fixed position on the BOLTS interface.

BRIEF DESCRIPTION OF THE DRAWINGS

The present invention will now be described with reference to the figures in which:

FIG. 3 is a cross-sectional side view of the ball joint of the BOLTS interface and the lateral adjustment plate of the tilt and go assembly according to the present invention;

FIG. 4 is front view of the ball joint on the BOLTS interface and the lateral adjustment plate of the tilt and go assembly according to the present invention;

FIG. 5 is an exploded perspective view showing the lateral adjustment plate adjacent a ball joint and interface plate of the load port interface assembly;

FIG. 7 is an exploded perspective view of a locking tab of the tilt and go assembly according to the present invention;

FIG. 8 is a front view of a locking tab of the tilt and go assembly according to the present invention; and FIG. 9 is a cross-sectional side view of a locking tab of the tilt and go assembly according to the present invention.

DETAILED DESCRIPTION

The present invention will now be described with reference to FIGS. 1–9, which in general relate to a system for quickly and easily affixing a load port assembly to a BOLTS interface. While a preferred embodiment of the BOLTS interface is adapted to operate with a 300 mm front opening load port and pod, it is understood that the present invention may operate to affix a load port assembly to BOLTS interfaces of various configurations. Additionally, it is understood that the type of process tool to which the present assembly is attached is not critical to the present invention, and may vary in alternative embodiments. Moreover, it is understood that the present invention complies with and allows compliance with all applicable SEMI standards.

Figure 1:
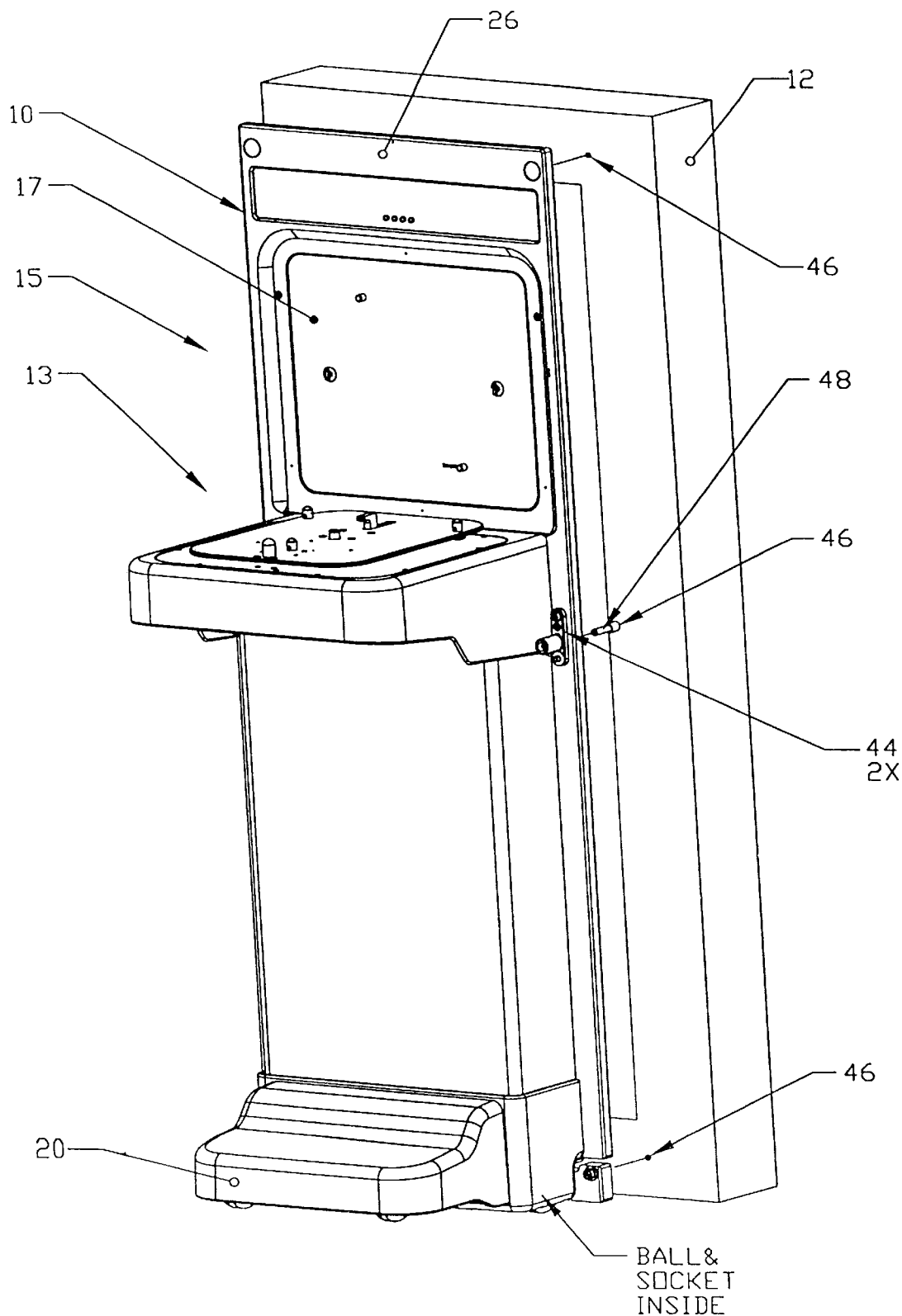
FIG. 1 is a perspective view of a load port interface assembly including a tilt and go assembly according to the present invention located adjacent to a BOLTS interface.
Figure 2:
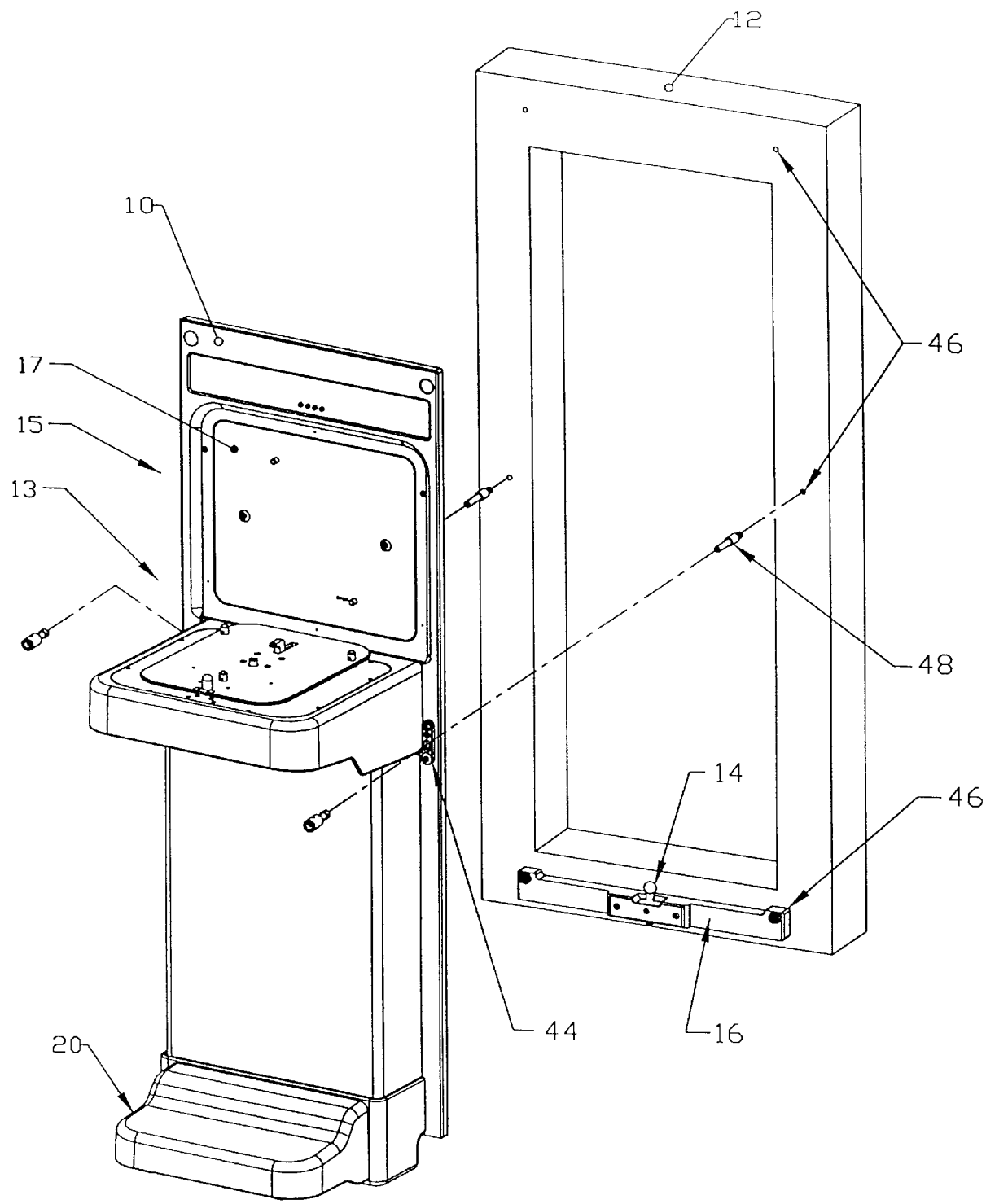
FIG. 2 is an exploded perspective view of a load port interface assembly including a tilt and go assembly according to the present invention proximate to a BOLTS interface.

Referring now to FIGS. 1 and 2, there is shown a mechanical load port interface assembly 10 positioned adjacent a BOLTS interface plate 12. Although not shown, the BOLTS interface plate 12 is preferably included as part of an exterior of a semiconductor process tool. The mechanical load port interface assembly 10 includes a load port 13 for supporting a pod and for facilitating transfer of wafers within the pod to and from the process tool through a process tool port 15 (shown covered by a port door 17). The load port interface assembly further includes a "tilt and go" assembly according to the present invention provided on and/or within the load port interface assembly 10 allowing the interface 10 to be mounted to the BOLTS interface plate 12 by a single person.

Figure 6A:
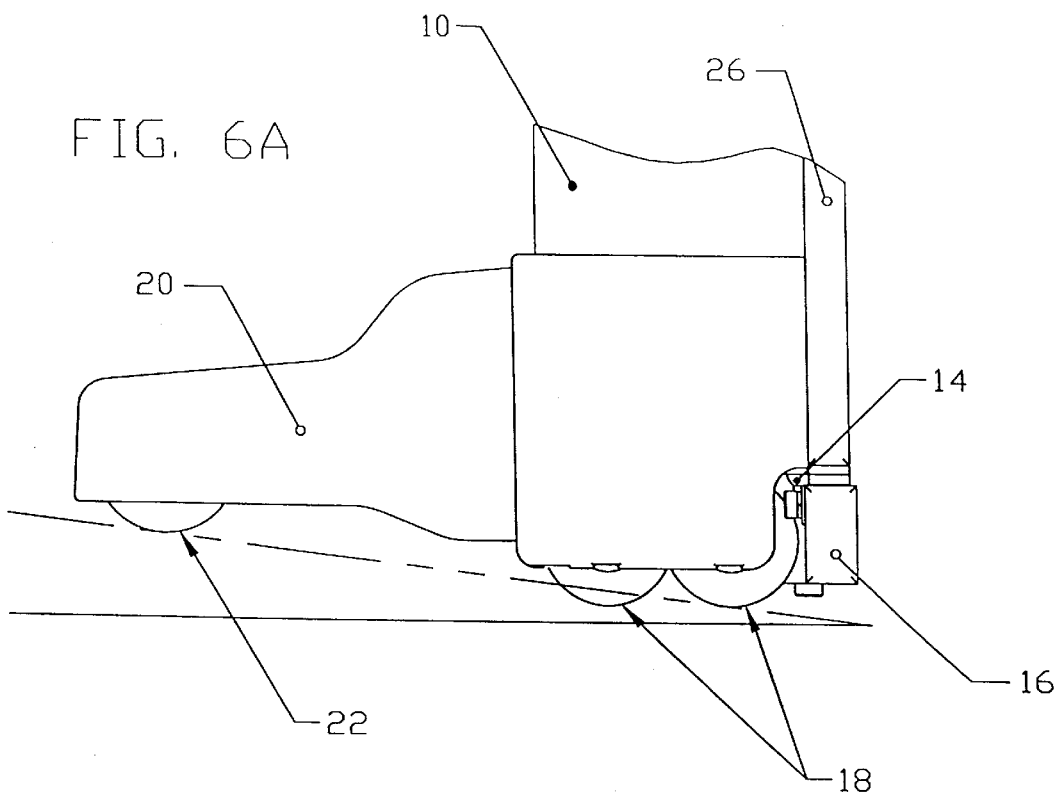
FIG. 6A is a partial side view of a tilt and go assembly according to an alternative embodiment of the present invention.
Figure 6:
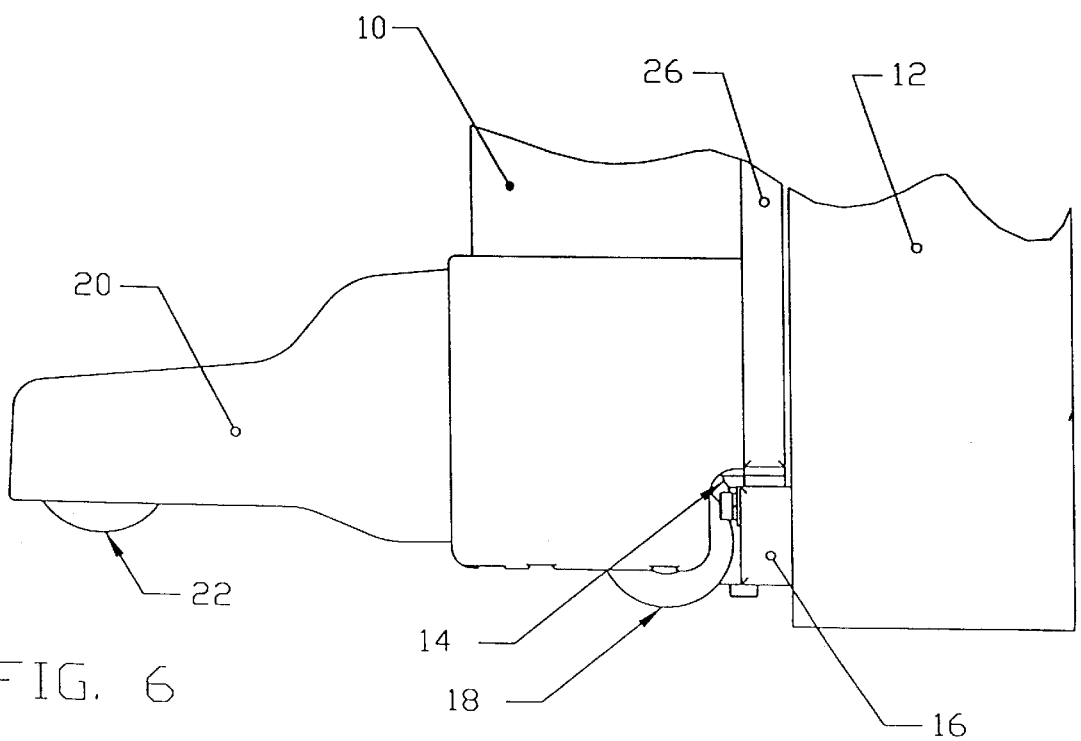
FIG. 6 is a partial side view of the tilt and go assembly according to a preferred embodiment of the present invention provided as part of a load port interface assembly.

As seen in FIGS. 1 and 6, the tilt and go assembly according to the present invention includes wheels 18 and 22 which allow the load port assembly 10 to be easily wheeled around and positioned adjacent a BOLTS interface plate 12. With the load port assembly 10 in an upright position (i.e., the frame of the load port assembly lying in a vertical plane), the axis of rotation of the wheels 18 is at a lower elevation than the axis of rotation of the wheels 22. Therefore, during transport, with both sets of wheels 18 and 22 on the ground, the frame of the load port assembly 10 is slanted. The orientation of the load port frame during transport is not critical to the present invention, and it is contemplated that the load port assembly be transported with only wheels 18 on the ground. In a further alternative embodiment of the invention shown in FIG. 6A, a second set of wheels 18 may be included to facilitate transport of the load port assembly in an upright position. The wheels 18 and 22 are preferably made of a low wear polymer.

In operation, the load port interface assembly 10 is wheeled to a position adjacent the BOLTS interface plate. Thereafter, the load port interface assembly may be tilted away from the BOLTS interface plate as a result of a force exerted on a base 20 at the foot of the load port interface assembly 10 to facilitate mounting of the assembly 10 on the BOLTS interface as explained hereinafter. The wheels 22 limit the tilting of the load port interface assembly. Alternative embodiments of the invention may include a single wheel 22, or wheel 22 may be omitted altogether. Where the wheel 22 is omitted, the assembly 10 would be transported only on wheels 18, and the base 20 would include a bottom member to limit the degree to which the assembly 10 may tilted away from the BOLTS interface.

As shown in the bottom of FIG. 2, and in greater detail in FIGS. 3, 4 and 5, the BOLTS interface plate 12 includes a ball joint 14 mounted to a plate 16 on the BOLTS interface plate 12. The ball joint 14 is preferably formed of a high strength and low wear material, such as for example stainless steel. It is understood that the ball joint 14 may be formed of other materials, such as for example—in alternative embodiments.

The tilt and go assembly according to the present invention further includes a lateral adjustment plate 24 provided on a bottom section of a load port interface plate 26. The interface plate 26 is a substantially planar portion of the load port interface assembly 10 located adjacent the BOLTS interface plate 12. As shown in FIGS. 3 through 5, a spherical detent is formed in a bottom portion of the lateral adjustment plate 24 to define a socket 28. Once the load port interface assembly 10 is positioned adjacent the BOLTS interface, a force may be exerted on base 20 to tilt the load port assembly away from the BOLTS interface and raise the socket 28 upward slightly so that it may then be seated over the ball joint 14. Thereafter, the load port interface assembly may be tilted upward so that the assembly is roughly parallel and adjacent to the BOLTS interface, and supported on the ball joint 14.

Although a preferred embodiment of the invention comprises a ball joint/socket coupling as described above, other mechanical couplings are contemplated in alternative embodiments. In one such alternative embodiment, the relative positions of the ball joint and socket may be reversed so that the ball joint is located on the lateral adjustment plate 24 and the socket is formed on the BOLTS interface. Moreover, in embodiments of the present invention not including mechanisms described hereinafter for adjusting the roll angle, it is contemplated that more than one ball joint/socket pairs be provided.

Although not shown in the figures, the ball joint 14 preferably includes a threaded lower portion which mates with threads in the plate 16 on the BOLTS interface. Once the load port interface assembly is seated on the ball joint, the load port interface assembly may be raised or lowered by rotating the ball joint. The mating threaded sections of the ball joint 14 and plate 16 will translate rotation of the ball joint into vertical translation of the ball joint and the load port interface assembly seated thereon. Once the load port assembly is located at the desired height, the position of the ball joint 14 may be locked by a set screw 32 provided within a screw hole 33 through the plate 16. The pitch of the threads in the ball joint 14 and plate 16 may be varied to vary the degree of vertical translation for a given rotation.

In addition to adjustment of the vertical height of the load port interface assembly 10 on the BOLTS interface, the tilt and go assembly according to the present invention includes a cam 34 seated within a slot 35 for adjustment of the load port interface assembly laterally (i.e., in a direction perpendicular to the Z-axis and parallel to the front of the BOLTS interface plate). In particular, cam 34 is rotationally mounted to the load port interface plate 26 by an eccentric pin 36. The cam 34 fits snugly within the slot 35 formed in the lateral adjustment plate 24. Seated on the ball joint 14, the lateral position of the lateral adjustment plate 24 and slot 35 is fixed. Therefore, upon rotation of the cam 34, the slot prevents lateral movement of the cam 35. Instead, rotation of the cam 34 in slot 35 results in lateral movement of the pin 36 and the load port interface plate 26. Once the desired lateral position of the load port interface plate 26 is achieved, clamp screws 40 may be tightened to secure the plate 26 in position. Clamp screws 40 ride within slots 42 formed within lateral adjustment plate 24 to allow for such lateral adjustment. The cam 34 may include a slot 38 capable of receiving a screwdriver or the like for rotating the cam 34. As would be appreciated by those of skill in the art, other schemes may be provided for accomplishing rotation of the cam 34.

After the bottom portion of the load port interface assembly 10 has been affixed and adjusted, the upper portion of the load port interface assembly may be secured to the BOLTS interface plate 12. In a preferred embodiment, locking tabs 44 may be provided on both sides of the load port interface assembly as shown for example in FIGS. 1 and 2. In addition to securing the load port interface assembly 10 to the BOLTS interface 12, the locking tabs allow adjustment of the azimuth and roll angles of the load port interface assembly 10. Adjustment of the azimuth angle of the assembly 10 allows the assembly 10 to be tilted toward and away from the BOLTS interface, about an axis through the ball joint 14 and socket 28 coupling. Adjustment of the roll angle of the assembly 10 allows the assembly 10 to be tilted in a plane parallel to the BOLTS interface, about an axis through the ball joint 14 and socket 28 coupling. The specific mechanisms for adjusting the azimuth and roll angles are discussed below.

The BOLTS interface plate 12 conventionally includes a plurality of screw holes 46 around its circumference. Prior to positioning of the load port interface assembly 10 on the BOLTS interface plate 12, a pair of pins 48 may be provided within selected holes 46. Referring now to FIGS. 7–9, the pins 48 have a first, threaded end 48a which is received within the holes 46 to secure the pins 48 to the BOLTS interface. The pins 48 also have a second end 48b opposite end 48a which protrudes from the BOLTS interface. A knob 56 of each locking tab 44 includes a threaded end 56a for screwing into a threaded bore in the end 48b to thereby affix the upper end of the load port assembly to the BOLTS interface.

In order to adjust the roll angle of the assembly 10 prior to locking down of the knobs 56, each locking tab is mounted to the interface plate 26 so as to pivot about an axis through a pivot screw 61 at a top of each locking tab. A locking screw 62 is further provided in the bottom of each locking tab, which screw 62 is received in an arcuate slot 64 in each locking tab. Before the pivot screw 61 and locking screw 62 in a locking tab are tightened, the locking tab is capable of pivoting from its central position (shown in solid in FIG. 8) either left or right (to the positions shown in phantom in FIG. 8). It is understood that the relative positions of the pivot screws 61 and locking screws 62 may be reversed in the locking tabs. Knobs 56 are also mounted within each locking tab, so that adjustment of the pivot angle of a locking tab with respect to the interface plate 26 will also adjust the position of the knob with respect to the interface plate 26. However, as the knob 56 will always be received in a fixed and repeatable position with respect to stationary pin 48, adjustment of the pivot angle of the locking tab will adjust the roll angle of the interface plate 26 and load port interface assembly 10 with respect to the BOLTS interface.

As would be appreciated by those of skill in the art, other configurations are possible for adjusting the roll angle of the assembly 10 with respect to the BOLTS interface 12. For example, the locking tabs 44, pivot screws 61 and locking screws 62 may be omitted, and the pins 48 may instead by mounted in slots formed in the BOLTS interface. In such an embodiment, the roll angle of the assembly 10 may be adjusted by adjusting the position of the pins 48 in their respective slots. As a further alternative, the mechanisms for adjusting the roll angle may be omitted altogether. Other known configurations for adjusting the roll angle are contemplated. Additionally, while the knob 56 is shown between the pivot and locking screws 61 and 62 on the locking tabs 44, it is understood that the position of the knob 56 may be above or below the pivot and locking screws 61 and 62 on the locking tabs 44 in alternative embodiments.

The azimuth angle may be adjusted by an azimuth screw 60 mounted in a threaded hole 58 in the interface plate 26. By rotating the azimuth screw 60, an end 60a of the screw 60 can extend out of the plane of the interface plate 26 to abut against the BOLTS interface. The degree to which the end 60a of the screw 60 extends past the plane of the interface plate 26 will determine the azimuth angle of the load port assembly 10. In the shown embodiment, the screw 60 is mounted in the interface plate 26 and must be adjusted through the locking tabs 44. Therefore, in the shown embodiment, either a slot or a hole needs to be formed in each locking tab over the azimuth screw. In the embodiment where a hole is formed, the azimuth angle must be adjusted before the locking tabs are pivoted. Where a slot is formed, the azimuth angle may be adjusted before or after the locking tabs are pivoted. In a further embodiment, the azimuth screws 60 may be mounted in a threaded hole in the locking tabs 44 and through a slot formed in the interface plate 26. In such an embodiment, the azimuth angle may be adjusted before or after the locking tabs are pivoted.

After the azimuth and roll angles are adjusted to position the load port assembly as desired with respect to the BOLTS interface, the knobs 56 may be tightened to secure the load port assembly 10 in a fixed position on the BOLTS interface 12. Those of skill in the art will appreciate that other schemes may be employed for varying the azimuth angle of the load port interface assembly with respect to the BOLTS interface. Additionally, it is understood that the mechanisms for adjusting the azimuth angle may be omitted altogether in alternative embodiments. Moreover, it is contemplated that the roll and/or azimuth angles may be adjusted prior to adjustment of the vertical and/or lateral position of load port interface assembly by the lateral adjustment plate 24 as described above.

The present invention has been described above as a tilt and go assembly for facilitating attachment of a load port interface assembly to a BOLTS interface. However, it is understood that the present invention may additionally be used to affix a load port interface assembly to a process tool not including the BOLTS interface. In such an embodiment, the process tool would include the ball joint and various attachment holes, pins and or screws as described above that would allow the tilt and go assembly to allow quick and easy attachment of the load port interface assembly to the process tool.

Although the invention has been described in detail herein, it should be understood that the invention is not limited to the embodiments herein disclosed. Various changes, substitutions and modifications may be made thereto by those skilled in the art without departing from the spirit or scope of the invention as described and defined by the appending claims.

We claim:

1. An assembly for facilitating attachment of a load port interface assembly to a process tool, the process tool including a support member at a lower portion of the process tool, the assembly comprising:

a coupling member for coupling with the support member, the process tool supporting the weight of the load port interface assembly upon said coupling of said coupling member with said support member;

means on the load port interface assembly for adjusting a lateral position of the load port interface assembly with respect to the process tool in a plane substantially parallel to a front of the process tool; and means for securing the load port interface assembly in a fixed position on the process tool.

2. An assembly as recited in claim 1, wherein said support member and coupling member comprise a ball joint and socket, respectively.

3. An assembly as recited in claim 1, wherein said support member and coupling member comprise a socket and ball joint, respectively.

4. An assembly as recited in claim 1, further comprising wheels on the load port interface assembly for transporting the load port interface assembly to the process tool.

5. An assembly for facilitating attachment of a load port interface assembly to a process tool the process tool including a support member at a lower portion of the process tool, the assembly comprising:

a coupling member for coupling with the support member, the process tool supporting the weight of the load port interface assembly upon said coupling of said coupling member with said support member;

means on the load port interface assembly for adjusting a roll angle of the load port interface assembly with respect to the process tool in a plane substantially parallel to a front of the process tool; and means for securing the load port interface assembly in a fixed position on the process tool.

6. An assembly as recited in claim 5, wherein said means for adjusting said roll angle adjusts the load port interface assembly about an axis through said socket and the ball joint.

7. An assembly as recited in claim 5, wherein said support member and coupling member comprise a ball joint and socket, respectively.

8. An assembly as recited in claim 5, wherein said support member and coupling member comprise a socket and ball joint, respectively.

9. An assembly as recited in claim 5, further comprising wheels on the load port interface assembly for transporting the load port interface assembly to the process tool.

10. An assembly for facilitating attachment of a load port interface assembly to a process tool, the process tool including a support member at a lower portion of the process tool, the assembly comprising:

a coupling member for coupling with the support member, the process tool supporting the weight of the load port interface assembly upon said coupling of said coupling member with said support member;

means on the load port interface assembly for adjusting an azimuth angle of the load port interface assembly with respect to the process tool in a plane substantially perpendicular to a front of the process tool; and means for securing the load port interface assembly in a fixed position on the process tool.

11. An assembly as recited in claim 10, wherein said support member and coupling member comprise a ball joint and socket, respectively.

12. An assembly as recited in claim 10, wherein said support member and coupling member comprise a socket and ball joint, respectively.

13. An assembly for facilitating attachment of a load port interface assembly to a BOLTS interface, the BOLTS interface including a support member at a lower portion of the BOLTS interface, the assembly comprising:

a coupling member for coupling with the support member, the BOLTS interface supporting the weight of the load port interface assembly upon said coupling of said coupling member with said support member;

means on the load port interface assembly for adjusting a lateral position of the load port interface assembly with respect to the process tool in a plane substantially parallel to a front of the process tool;

means on the load port interface assembly for adjusting a roll angle of the load port interface assembly with respect to the process tool in a plane substantially parallel to a front of the process tool;

means on the load port interface assembly for adjusting an azimuth angle of the load port interface assembly with respect to the BOLTS interface in a plane substantially perpendicular to a front of the BOLTS interface; and means for securing the load port interface assembly in a fixed position on the BOLTS interface.

14. An assembly for facilitating attachment of a load port interface assembly to a BOLTS interface, the BOLTS interface including a ball joint at a lower portion of the BOLTS interface, the assembly comprising:

a lateral adjustment plate translationally mounted to the load port interface assembly, said lateral adjustment plate include a slot;

a socket, formed in a lower surface of said lateral adjustment plate, for seating over the ball joint to support the weight of load port interface assembly on the BOLTS interface;

a cam mounted by an eccentric pin to the load port interface assembly, said cam fitting within said slot, wherein rotation of said cam adjusts a lateral position of the load port interface assembly with respect to said lateral adjustment plate and the BOLTS interface; and means for securing said lateral adjustment plate in a fixed position with respect to the load port interface assembly.

15. An assembly as recited in claim 14 wherein the BOLTS interface includes a pin extending from the BOLTS interface toward the load port interface assembly, the assembly further comprising:

a hole in the load port interface assembly, the pin capable of fitting through said hole; and a knob fitting over the pin, said knob capable of securing the load port assembly in a fixed position;

wherein said hole is larger than said pin so that the pin may fit through said hole while the load port interface assembly is inclined at a first angle with respect to a vertical axis in a plane generally parallel to the BOLTS interface, and the pin may fit through said hole while the load port interface assembly is inclined at a second angle with respect to a vertical axis in said plane generally parallel to the BOLTS interface, said first angle being different than said second angle.

16. An assembly as recited in claim 14, further comprising a threaded member fitting through the load port interface assembly, said threaded member capable of extending out past a rear plane of the load port interface assembly and into contact with the BOLTS assembly, a degree to which said threaded member extends past said rear plane determining a roll angle of the load port interface assembly with respect to the process tool in a plane substantially parallel to a front of the process tool.

* * * * *